(12) United States Patent
Ganzhorn et al.

(10) Patent No.: US 10,452,991 B1
(45) Date of Patent: Oct. 22, 2019

(54) CROSS-TALK COMPENSATION IN QUANTUM PROCESSING DEVICES

(71) Applicant: International Business Machines Corporation, Armonk, NY (US)

(72) Inventors: Marc Ganzhorn, Muhen (CH); Daniel Josef Egger, Thalwil (CH); Stefan Filipp, Zurich (CH); Gian R. von Salis, Aeugst am Albis (CH); Nikolaj Moll, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/111,784

(22) Filed: Aug. 24, 2018

(51) Int. Cl.
*H03K 19/195* (2006.01)
*G06N 10/00* (2019.01)
*H03K 19/0175* (2006.01)

(52) U.S. Cl.
CPC ..... *G06N 10/00* (2019.01); *H03K 19/017545* (2013.01)

(58) Field of Classification Search
CPC ................................ G06N 10/00; B82Y 10/00
See application file for complete search history.

(56) References Cited

U.S. PATENT DOCUMENTS

| | | | |
|---|---|---|---|
| 8,865,537 B2 | 10/2014 | Abraham et al. | |
| 8,972,921 B2 | 3/2015 | Abraham et al. | |
| 2009/0078932 A1* | 3/2009 | Amin | G06N 10/00 257/31 |
| 2016/0292587 A1* | 10/2016 | Rigetti | G06F 13/36 |
| 2017/0062692 A1 | 3/2017 | Dial et al. | |
| 2017/0193388 A1 | 7/2017 | Filipp et al. | |
| 2017/0230050 A1* | 8/2017 | Rigetti | G01R 33/02 |

OTHER PUBLICATIONS

R. Barends et al. "Superconducting Quantum Circuits at the Surface Code Threshold for Fault Tolerance" Nature vol. 508, Apr. 24, 2014.
Yu Chen et al. "Qubit Architecture with High Coherence and Fast Tunable Coupling" Physical Review Letters Nov. 28, 2014.
Michael R. Geller et al. "Tunable Coupler for Superconducting Xmon Qubits: Perturbative Nonlinear Model" Department of Physics and Astronomy, University of Georgia. Dated May 9, 2014.
Chad Rigetti and Michel Devoret "Fully Microwave-tunable Universal Gates in Superconducting Qubits with Linear Couplings and Fixed Transition Frequencies" Department of Applied Physics, Yale University published Apr. 5, 2010.

(Continued)

Primary Examiner — Anh Q Tran
(74) Attorney, Agent, or Firm — Harrington & Smith

(57) ABSTRACT

A method for operating a quantum processing device is provided including at least two quantum circuits coupled to a tunable coupler, wherein the quantum circuits are subject to cross-talk, the method including: applying a primary signal to the quantum circuits so as to drive one or more energy transitions between states spanned by the quantum circuits; and applying a compensation signal to the tunable coupler, the compensation signal designed so as to shift at least one state spanned by the quantum circuits, in energy, to compensate for cross-talk between the quantum circuits. Related quantum processing devices and chips are also provided.

18 Claims, 6 Drawing Sheets

(56) References Cited

OTHER PUBLICATIONS

Jerry M. Chow et al. "Microwave-activated Conditional-Phase Gate for Superconducting Qubits" New Journal of Physics published Nov. 19, 2013.
R. C. Bialczak et al. "Fast Tunable Coupler for Superconducting Qubits" Physical Review Letters published Feb. 11, 2011.
Sarah Sheldon et al. "Procedure for Systematically Tuning up Crosstalk in the Cross Resonance Gate" dated Mar. 16, 2016.
David C. McKay et al. "A Universal Gate for Fixed-Frequency Qubits via a Tunable Bus" dated Dec. 20, 2016.
IBM U.S. Appl. No. 15/927,502, filed Mar. 21, 2018. "Fast Quantum Gates with First-Order Transitions Via Frequency-Modulated Tunable Coupling Element".
IBM Appendix P.

* cited by examiner

CROSS-TALK COMPENSATION IN QUANTUM PROCESSING DEVICES

BACKGROUND

The invention relates in general to the field of quantum processing devices and operation thereof. In particular, it is directed to methods of operating quantum processing devices with quantum circuits (e.g., superconducting qubits), coupled to a frequency-tunable coupler, as well as related devices. Such methods aim at compensating for cross-talk between the quantum circuits.

Recent advances in quantum computing are making such a technology ever more relevant to industrial applications. Quantum computing makes direct use of quantum-mechanical phenomena, such as superposition and entanglement to perform operations on entangled quantum bits, i.e., states stored in quantum bits. Superconducting circuits are relatively easy to manufacture with current technologies and are thus promising candidates to further scale quantum information technologies.

Possible applications on quantum machines include the solving of hard optimization problems that are beyond the reach of classical algorithms. For example, quantum optimizations based on the variational principle are particularly appealing.

Quantum computing ideally needs a rapid and high-fidelity generation of entangled qubit states. For example, two-qubit gates are known, which are implemented with transmon (fixed-frequency) qubits, where the qubits are coupled via a frequency tunable coupler element. In contrast to other approaches, this implementation takes advantage of the high coherence of fixed-frequency qubits to generate entangled two qubit states with fidelities of more than 97%.

In particular, an architecture has been proposed, wherein two qubits are connected to a single tunable coupler, by David C. McKay and co-workers (Phys. Rev. Appl. 6, 064007 (2016)). This architecture allows transitions between two states of the two qubits to be parametrically driven, by modulating the tunable coupler energy at a frequency that corresponds to the difference of the energy between the two states.

More generally, quantum computing relies upon the ability to accurately control the states of the quantum circuits (e.g., qubits) making up the system. This involves being able to individually address each quantum bit in a well-defined manner as well as to create at least two qubit operations. When cross-talk between qubits is present, it is no longer possible to address one qubit without selectively and accurately knowing the state of the others. The dynamics of one qubit depends on the state of the others, which amounts to an unwanted two-qubit gate (controlled unitary operation). Thus, the presence of cross-talk impedes the operation of quantum computing devices.

SUMMARY

According to a first aspect, the present invention is embodied as a method of operating a quantum processing device. The device comprises at least two quantum circuits, which are coupled to a tunable coupler. This coupler is frequency-tunable: its frequency can be modulated, e.g., so as to drive energy transitions in the quantum processing device. The quantum circuits are assumed to be subject to cross-talk in the device. Basically, the present method revolves around the application of two signals, which include a primary (modulated) signal and a compensation signal. On the one hand, the primary signal is applied to the quantum circuits (possibly via the tunable coupler) so as to drive one or more energy transitions between states spanned by the quantum circuits. On the other hand, the compensation signal applied is designed so as to shift (in energy) at least one state spanned by the quantum circuits, in order to compensate for cross-talk between two of the at least two quantum circuits.

According to another aspect, the invention is embodied as a quantum processing device. Consistently with the above method, the device comprises at least two quantum circuits and a tunable coupler, to which the circuits are coupled. The quantum circuits are again assumed to be subject to cross-talk. The device further comprises a control unit, which is configured to apply two signals, this including both a primary signal and a compensation signal for cross-talk, as described above.

According to a third and final aspect, the invention is embodied as a quantum processing chip. The chip includes a plurality of cells, each comprising at least two quantum circuits (again subject to cross-talk) and a tunable coupler, to which the quantum circuits are coupled. The quantum processing chip further comprises one or more control units, making up a control system. Consistently with the present method, the control units are configured in the chip to apply, for each of the cells, signals so as to drive energy transitions, while compensating for cross-talk between the quantum circuits in the cell, in operation of the chip.

Quantum processing devices, chips, and methods embodying the present invention will now be described, by way of non-limiting examples, and in reference to the accompanying drawings.

BRIEF DESCRIPTION OF SEVERAL VIEWS OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which:

FIG. 4b) shows hybridized qubit states in the presence of cross-talk. The wavy line denotes a frequency separation between the two states, which corresponds to the frequency of a compensation tone to be applied for a transition from one state to the other. FIG. 4c) depicts hybridized states as obtained after compensation, such that the $|-\rangle$ state has the same energy as the $|11\rangle$ state in the absence of cross-talk (see FIG. 4a));

Figure 2:
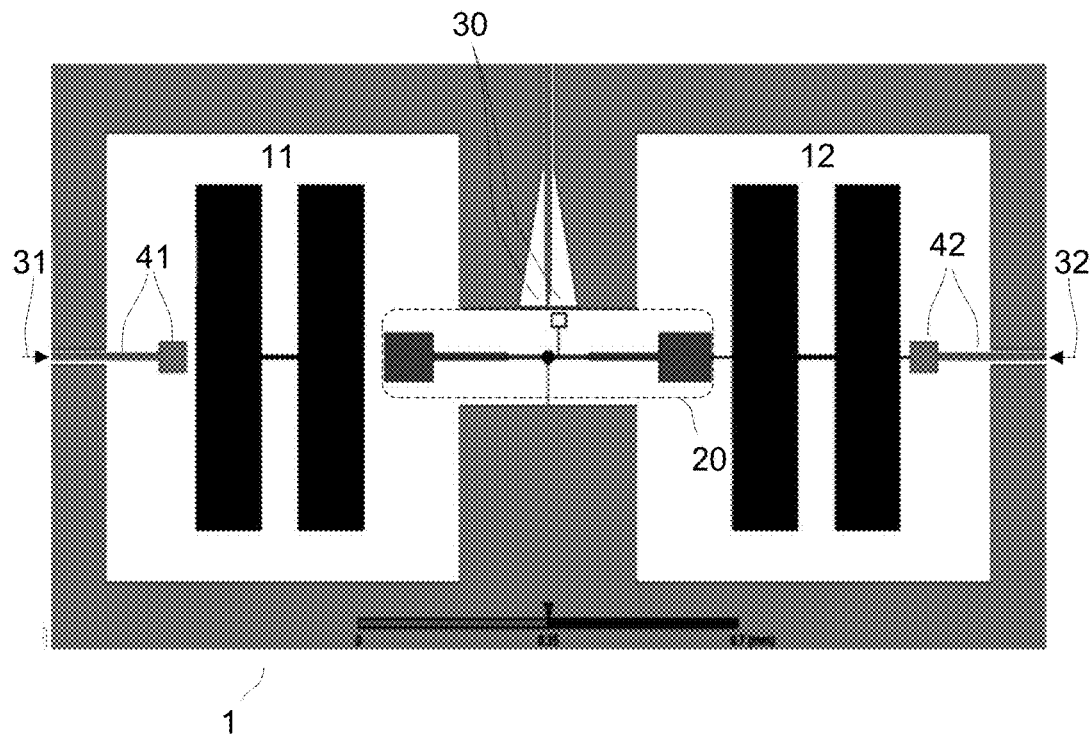
FIG. 2 shows an example geometry for a qubit coupling architecture as in FIG. 1.

The accompanying drawings show simplified representations of devices or parts thereof, as involved in embodiments. Technical features depicted in FIG. 2 are not necessarily to scale. Similar or functionally similar elements in the figures have been allocated the same numeral references, unless otherwise indicated.

DETAILED DESCRIPTION OF EMBODIMENTS OF THE INVENTION

In many quantum chip architectures, computational qubits are not directly coupled but linked together with coupling elements such as microwave resonators. This reduces cross-talk to some degree because the qubits can be spaced further apart. In addition to the indirect coupling via the resonators, some configurations may also give rise to unwanted qubit-qubit couplings, e.g., via a direct capacitive coupling of the qubits, resulting in unwanted cross-talk. Moreover, cross-talk sets a lower bound on the distance between the qubits and, therefore, impedes qubit arrangements with small footprints.

In more detail, cross-talk manifests itself by a shift of the qubit frequency conditional on the state of the other qubits on the processor (assuming a two-qubit configuration); this is referred to as an unwanted $\hat{z}_1 \hat{z}_2$ interaction where $\hat{z}_i$ is the z-Pauli operator on qubit i. More specifically, let $\omega_{ij}$ be the transition energy from the qubit ground state $|ij\rangle$ to the excited state with qubit 1 in state i and qubit 2 in state j, where i,j∈{0,1}. In the absence of cross-talk the relation $\omega_{11}=\omega_{01}+\omega_{10}$ holds, i.e., the energy of the double-excited state equals the sum of the individual qubit energies. However, when an unwanted $\hat{z}_1 \hat{z}_2$ interaction is present this relation no longer holds, i.e., $\omega_{11} \neq \omega_{01}+\omega_{10}$. When this happens the fidelity of the single qubit and two qubit gates deteriorates since the gate parameters no longer match the qubit parameters. All the more, this implies that transitions/gates on one qubit depends on the state of the other qubit in an uncontrolled manner.

A quantum gate for superconducting qubits is an electrical signal whose spectral content depends both on the desired gate and on the qubit parameters. Even a slight shift in qubit parameters (such as frequency) creates a mismatch between the signal applied and the system that this signal is driving. This hinders the operation of the qubits, inasmuch as it makes it difficult to achieve and calibrate single qubit gates that do not depend on the state of other qubits. Thus, such mismatches quickly deteriorate the accuracy of the quantum evolution. Accordingly, cross-talk between the quantum circuits is detrimental to the operation of the quantum processing system.

When the frequency of the qubits is controllable the unwanted qubit-qubit cross-talk can to some degree be mitigated using the control lines that tune the frequency of the qubits. Setting the qubits far away in frequency space reduces cross-talk. This, however, is not possible when the frequency of the qubits cannot be tuned. Moreover, since the coupling falls off only with the inverse of the difference frequency, a large frequency tuning range is required to sufficiently suppress the cross-talk. Tunable coupling elements have been used in quantum computing architectures to reduce cross-talk whilst relaxing the required spectral separation between the qubits. There, however, the tunable coupler must be biased at a well-defined flux to suppress cross-talk. This exact bias point is in practice hard to achieve and qubit-qubit cross-talk, despite being suppressed, is still present.

Fixed-frequency qubits do not feature a SQUID loop and are thus more robust against flux noise. This increases their coherence times but comes at the expense of qubit frequency control. Some quantum gates such as the cross-resonance gate have been developed specifically for fixed-frequency qubits coupled dispersively via a non-tunable coplanar waveguide resonator. In such systems, gates have been created by using a microwave pulse to induce a 2g coupling between the qubits.

Fixed-frequency qubit architectures that feature tunable couplings open-up additional possibilities. For instance, an architecture based on fixed-frequency qubits and a tunable coupler passively mitigate measurement cross-talk by biasing the coupling element at a specific point.

Contrary to the prior art approaches, the present approach involves quantum circuits (e.g., fixed-frequency qubits), coupled to a frequency-tunable coupler, wherein signals are applied (e.g., as a synthesis signal to the tunable coupler), which incorporate a compensation signal (in addition to signals for driving transitions) for directly compensating for cross-talk between the quantum circuits, when driving the desired transitions among states of the quantum circuit system.

In reference to FIGS. 1-9, a first aspect of the invention is now described in detail, which concerns a method of operating quantum processing devices 1. Examples of such devices, which concern other aspects of the invention, are described later in detail, in reference to FIGS. 1-3 and 5. Essentially, the device 1 comprises a frequency-tunable coupler 20, as well as n quantum circuits 11, 12 (n≥2). Such circuits are preferably fixed-frequency circuits, wherein each of the quantum circuits normally have distinct frequencies, for reasons that will become apparent later.

Most embodiments discussed herein assume that the quantum processing device is a computing device 1, in which the quantum circuits 11, 12 are meant to be used as computational circuits (e.g., computational qubits). Still, the skilled person may appreciate that the present invention further extends to quantum sensing devices, where the quantum circuits are implemented as sensors. In principle, the less crosstalk or parasitic signals the better the sensitivity of the sensors. Note, however, that the active compensation scheme proposed herein may impact the sensitivity of the sensor. In all cases, the tunable coupler 20 is, in the present context, not meant to be used as a computational quantum circuit in the processing device 1, even though the coupler 20 can practically be embodied as a qubit, as discussed later in detail. Rather, the role of the coupler 20 is merely to couple the quantum circuits, e.g., to achieve desired energy transitions between states spanned (i.e., subtended) by such circuits, when operating the device.

Figure 1:
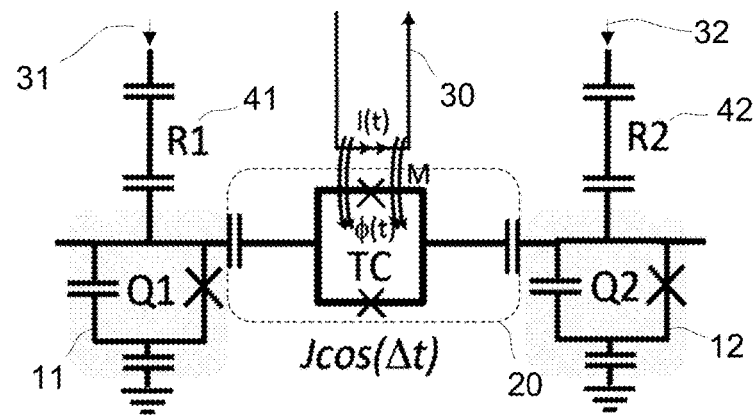
FIG. 1 shows a circuit diagram corresponding to an example of qubit coupling architecture, involving a frequency-tunable coupler, to which two fixed-frequency qubits are coupled, as involved in embodiments of the invention. The two fixed-frequency qubits are meant to act as computation qubits, contrary to the coupler, as in embodiments.

The device 1 thus comprises two or more quantum circuits 11, 12, which are, each, coupled to the tunable coupler 20, as depicted in FIGS. 1, 2. As assumed in the following, such quantum circuits 11, 12 preferably are fixed-frequency circuits, for reasons explained later. On the contrary, the coupler is tunable in frequency, meaning that the frequency of the coupler 20 can be modulated, e.g., so as to drive energy transitions in the quantum processing device, via the coupler. The quantum circuits are further assumed to be subject to cross-talk in this configuration, as explained earlier.

The present method basically revolves around the application of two functionally different types of signals. On the one hand, a primary signal is applied to the quantum circuits 11, 12 (possibly via the tunable coupler 20), so as to drive energy transitions between states spanned by the quantum circuits, while, on the other hand, a compensation signal is applied to the tunable coupler, which signal is designed so as to shift one or more states spanned by the quantum circuits (in energy or, equivalently, in frequency), in order to compensate for cross-talk between the quantum circuits.

In embodiments, the primary signals can be applied to the quantum circuits via drive lines 31, 32 (see FIG. 2), i.e., independently from the coupler 20, while the compensation signal is applied via the line 30 to the tunable coupler 20. In variants, however, both the primary and compensation signals can be applied to the tunable coupler 20 via the line 30. More generally, the primary signals may be applied via any of, or all the lines 30-32, or, still any subsets thereof, depending on the operations to be achieved (e.g., whether single- or two-qubit gates are sought, etc.), as known per se, while the compensation signals are applied via the tunable coupler 20.

In the following, it is assumed that both the primary and compensation signals are applied as a synthesis signal to the tunable coupler 20, via the line 30, see step S60 in the flowchart of FIG. 9, as well as the diagram of FIG. 3. This, however, does not preclude the possibility for additional ("primary") signals to be applied via the drive lines 31 and/or 32. The synthesis signal applied S60 via the line 30 includes a compensation signal, in addition to a primary signal used to drive the desired energy transitions. That is, the primary signal is modulated S51 so as to modulate the frequency of the tunable coupler 20, upon application S60 of the synthesis signal to the coupler 20, and thereby drive energy transitions between states spanned by the quantum circuits 11, 12 (via the tunable coupler 20), as known per se. On the other hand, the synthesis signal further incorporates a compensation signal, which is designed to compensate for cross-talk between the quantum circuits 11, 12 of the device 1. Such a compensation signal will typically arise from a different source than the primary signal and have a distinct frequency.

Figure 4:
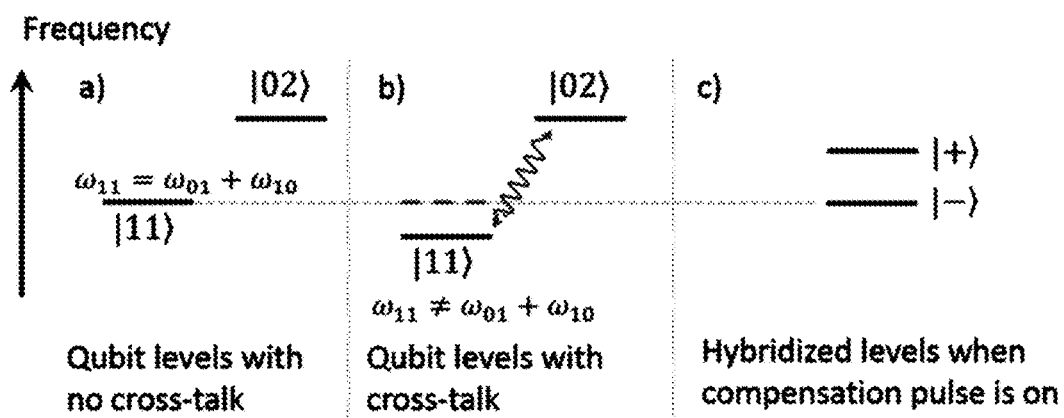
FIG. 4 shows energy level diagrams depicting quantum states associated to two computational qubits coupled to a tunable coupler, as in FIG. 1, as well as possible energy transitions between qubit states, as involved in embodiments of the present methods. In particular, FIG. 4a) depicts a two-state level diagram in absence of cross-talk between the qubits. I.e., the dashed (grey) line is located at the level at which the |11⟩ qubit-state would lie in absence of cross-talk.

Thus, and as the present Inventors have realized, an additional signal component can be embedded in the applied signals, which component is devised so as to shift (in energy or frequency) at least one state spanned by the quantum circuits, in order to compensate for cross-talk between the quantum circuits 11, 12, as exemplified latter in reference to FIG. 4. In particular, a same tunable coupler can be energized to both drive transitions between states of the system and compensate for cross-talk between the circuits, thanks to a two-component synthesis signal applied to the coupler 20.

Applying the additional compensation signal makes it possibly to cure the mismatch between the primary signals and the system that this primary signal is meant to drive. In particular, the present approach makes it possible to achieve and calibrate single qubit gates that do not depend on the state of other qubits, such that the accuracy of the quantum evolution realized can be maintained over a longer period of time.

Moreover, embodiments of the present invention leverage short operation times allowed by the signals applied S60, as well as the high-coherence of the fixed-frequency circuits. In that respect, we note that concomitant transitions may possibly be contemplated, e.g., by concomitantly modulating the frequency of the coupler 20 atm frequencies, e.g., to achieve high gate rates, while altogether embedding cross-talk correction signals within the applied signals. Using a suitable synthesis signal, for example, the cross-talk compensation does not impact the operation times of the quantum circuits. This way, the quantum circuits can possibly be entangled within a single, short operation, such that short state preparation can be obtained. This, in turn, preserves the possibility for a quantum processing device to be scaled to a larger number of quantum circuits. In addition, the present approach may be leveraged for a quantum computer to perform with less error.

Figure 3:
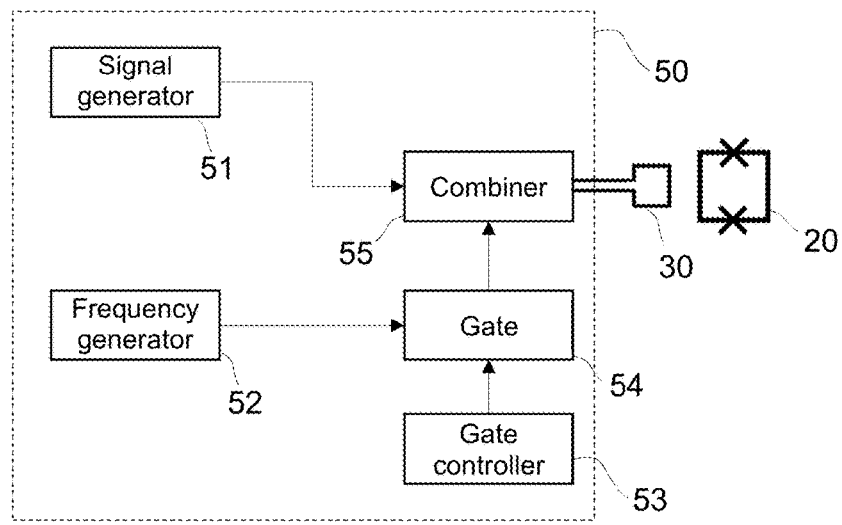
FIG. 3 is a block diagram of selected components of a quantum processing device. In particular, it shows a possible layout for a controller responsible for gating a cross-talk compensation signal, as in embodiments.

As assumed in FIGS. 1-3, each of the quantum circuits 11, 12 is preferably a transmon-type superconducting quantum circuit, with, e.g., the tunable coupler capacitively coupled to each of the quantum circuits. The tunable coupler 20 may notably be implemented as a superconducting quantum interference device loop (or SQUID loop for short). In this case, the synthesis signal is advantageously applied S60 by altering a magnetic flux penetrating the SQUID loop, as illustrated in FIG. 1 and later described in reference to another aspect of the invention.

Operations as described herein may further require to suitably set amplitudes and phases of the signals applied S60, e.g., so as to achieve an entangled state of the quantum circuits. This way, quantum processing devices (such as described later in reference to FIGS. 1-3) can be operated so as to implement one or more quantum gates, where each gate may operate on one or more of the quantum circuits. However, since the tunable coupler is here not meant to be used as a computational qubit, the quantum gates will not operate (at least not in effect) on states of the tunable coupler.

Figure 9:
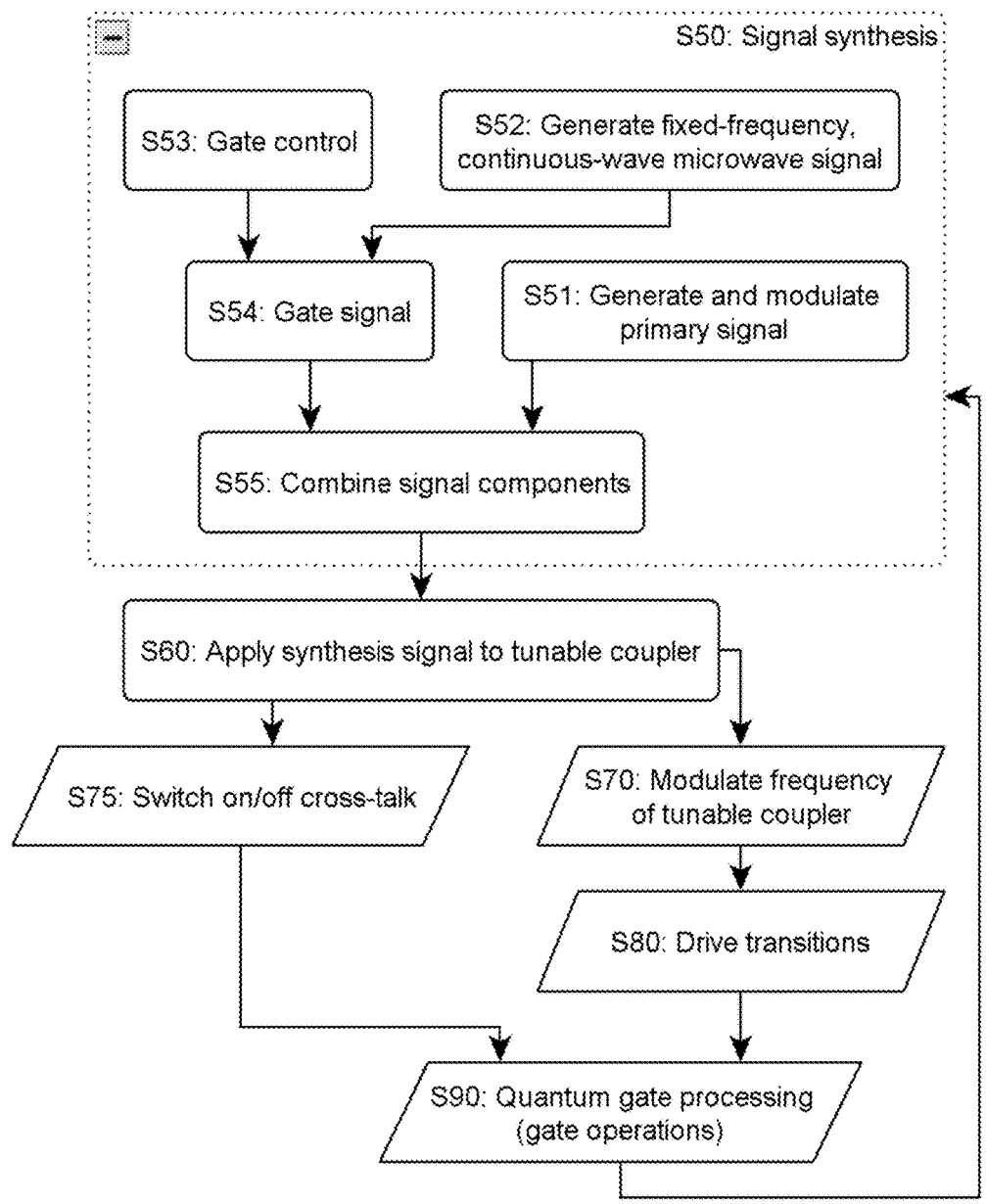
FIG. 9 is a flowchart illustrating high-level steps of a method of operating a quantum processing device according to embodiments.

For example, referring to FIG. 9, the modulation performed at step S51 and the application S60 of the synthesis signal to the coupler 20 happen to modulate S70 the frequency of the coupler in accordance with the modulated signal S51. The frequency of the tunable coupler 20 may notably be modulated concomitantly at m frequencies (m>1), so as to drive m energy transitions between connected pairs of states spanned by the quantum circuits and achieve an entangled state as a superposition of l states spanned by the quantum circuits, where l≥m. Now, each of the concomitant signals applied may encompass a compensation signal, following same principles as described above.

This, in turn, may for instance be exploited to implement gate operations S90. E.g., the frequency modulation of the coupler 20 can be used to drive transitions as necessary to implement S80 a quantum gate operating on the quantum circuits 11, 12 (but effectively not on the tunable coupler 20), while altogether compensating for cross-talk.

Note, in the present context, such quantum gates will typically operate on two or more of the quantum circuits. However, since the crosstalk compensation improves coherence, the present compensation scheme may also be leveraged to improve single qubit gates.

The frequency of the tunable coupler 20 may notably be modulated S70 so as to implement S80 a universal set of gates based on states of the at least two quantum circuits 11, 12, where such gates are agnostic to states of the tunable coupler, for the same reasons as mentioned above. Amplitudes and phases of signals applied to the tunable coupler 20 may typically need be set, prior to, or while modulating S51 the frequency of the primary signals, so as to achieve, e.g., an iSWAP gate, a c-Phase gate, a Fredkin gate (also known as also CSWAP gate) or a square root of SWAP gate (commonly denoted by $\sqrt{SWAP}$), or any combination of such gates.

The signal synthesis is now described in detail. While the signal synthetized may possibly be adequately shaped ab initio (e.g., thanks to an arbitrary waveform generator with sufficient sampling rate and bandwidth) so as to effectively include the two types of signal contributions needed, it will be much easier (and less costly) in practice to separately form the two signal components and then combine them, as assumed in FIGS. 3 and 9. That is, the desired signal is preferably synthetized S50 by, on the one hand, modulating S51 a primary signal and, on the other hand, obtaining S52, S53 a desired compensation signal, prior to combining S55 the compensation signal obtained with the primary signal. In that case, the two signal components are generated in parallel, prior to being combined S55, e.g., thanks to a linear circuit. The resulting signal will typically be a mere superposition of the two input signals.

The compensation signal may for instance simply be obtained by first generating S52 a signal with a frequency generator 52, prior to gating S53 the generated signal to obtain a desired signal pulse, e.g., using a gate 54 controlled by a gate controller 53, as illustrated in FIG. 3. In more sophisticated (but less preferred variants), an arbitrary waveform generator may again be used for the purpose of generating the compensation signal. Note that gating the compensation signal is typically used to avoid interference with the measurement pulses. There is, however, no strict need to gate S53 the compensation signal, which could simply be applied as a continuous signal.

Note, preferred embodiments are directed to microwave activated qubits (e.g., transmon-type, superconducting qubits). In such cases, the primary signal can be modulated S51 so as to generate a harmonic microwave signal, using techniques known per se. Meanwhile, the compensation signal can be obtained by first generating S52 a fixed-frequency, continuous-wave microwave signal, and subsequently gating S53 (if needed) the microwave signal generated. This way, a simple and cost-effective compensation scheme is achieved. The resulting signal components are combined at step S55 and subsequently applied S60 to the tunable coupler 20, as illustrated in FIG. 9.

Referring now to FIG. 4, the microwave signal generated at step S52 shall advantageously have a frequency selected so as to reduce or even effectively suppress a frequency shift (e.g., of the $\hat{z}\hat{z}$ type) between two states of the system, as induced by cross-talk between two quantum circuits 11, 12. This effectively amounts to turn off cross-talk between the quantum circuits 11 (e.g., as shown by operation S75), 12, as discussed below in detail. Conversely, by blocking the gate (e.g., during a next cycle of operations S50-S90), one may effectively restore (i.e., turn on) the cross-talk.

In practice, cross-talk may typically give rise to hybridized states of the quantum circuits (excluding the coupler), see FIG. 4b). Yet, the compensation signal can be designed S52-S54 such as for the energy of one of the hybridized states (e.g., the lower state $|-\rangle$) to correspond to the energy that one of the initial states (e.g., superposition states) spanned by the quantum circuits 11, 12 (such as the bare qubit state $|11\rangle$) would have in absence of cross-talk between the quantum circuits 11, 12, as illustrated in FIG. 4c). Note, a bare state amounts to a tensor product of individual qubit states while a hybridized state is a superposition (a linear combination) of such tensor products.

Variants of the present method as described above may be combined in multiple ways. For example, preferred embodiments of the present method are based on a system including fixed-frequency, superconducting qubits 11, 12 and tunable couplers 20, which allows turning on and off the qubit cross-talk. The tunable coupler 20 is then preferably implemented as a SQUID loop. Threading a magnetic flux through the SQUID loop allows its transition frequency to be controlled, see FIG. 1. There, a parametric modulation of the tunable coupler frequency creates different interactions between the qubit states. In particular, the frequency of the tunable coupler 20 may be modulated S70 so as to induce transitions between qubit states by providing the system with the energy needed to induce such transitions, e.g., to generate a multipartite entanglement. Meanwhile, an extra pulse can easily be added to each drive signal of interest, using a simple gate 54 and gate controller 53, to remove cross-talk between the qubits.

The tunable coupler 20 may for instance be operated using a control unit as shown in FIG. 3, which applies a gated microwave compensation signal to turn on or off the cross-talk between the qubits, in addition to any drive signals as required for quantum gate operations between the qubits. As said, the compensation signal is preferably a fixed-frequency, continuous-wave microwave tone. Of particular advantage is to use a simple gating system 53, 54 to switch on/off the compensation signal, without involving a complex pulse shaping. This, in turn, allows interferences with measurement tones or thermal heat-load on the system to be reduced.

In the example of FIG. 4, the compensation signal is activated by applying a microwave tone on the tunable coupler 20, which in turn induces a transition between the qubit states $|11\rangle$ and $|02\rangle$. Cross-talk hybridizes these levels into two new levels $|+\rangle$ and $|-\rangle$, having energies denoted by $\omega_+$ and $\omega_-$, whose energy splitting $\Delta E = \omega_+ - \omega_-$ depends on the strength and frequency of the drive. Now, by properly choosing the compensation drive strength and frequency, one of the hybridized levels will have the same energy as the bare qubit $|11\rangle$ state in the absence of cross-talk, compare FIG. 4c) and FIG. 4a). This hybridized state can then serve as a computational state corresponding to an excitation of both qubits, in view of performing S90 gate operations.

Figure 6:
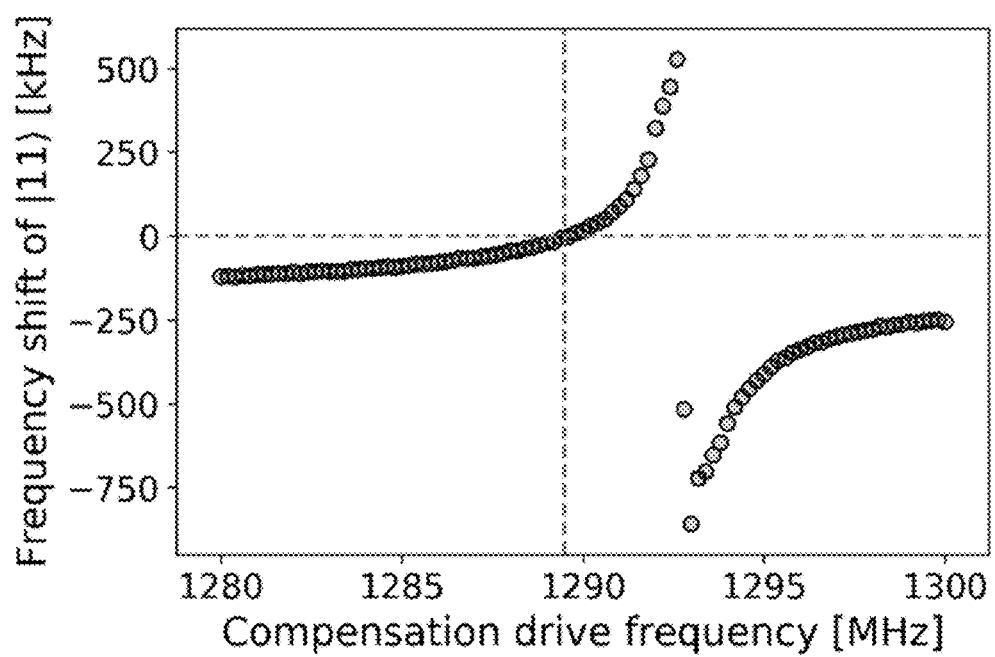
FIG. 6 is a graph reflecting the experimental determination of the frequency shift of a given qubit state with respect to the compensation drive frequency used for the cross-talk compensation signal, for a given qubit setup. The dashed lines illustrate the experimental determination of an optimal compensation signal frequency, as involved in embodiments.

Scanning the frequency of the compensation tone at a fixed power and measuring the induced frequency shift of the $|-\rangle$ state reveals that there is a point where the cross-talk induced $\hat{z}\hat{z}$ shift disappears, as identified by the dashed lines in FIG. 6, for a given set of qubit parameters.

Figure 7:
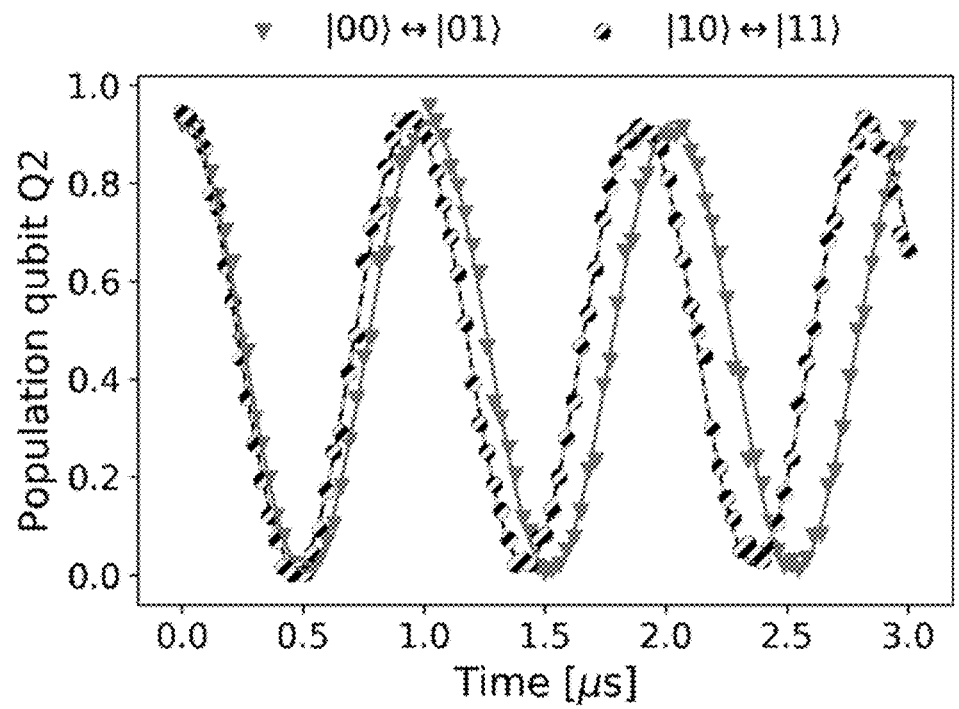
FIG. 7 illustrates Ramsey measurements of a qubit on a two-qubit chip without cross-talk compensation.
Figure 8:
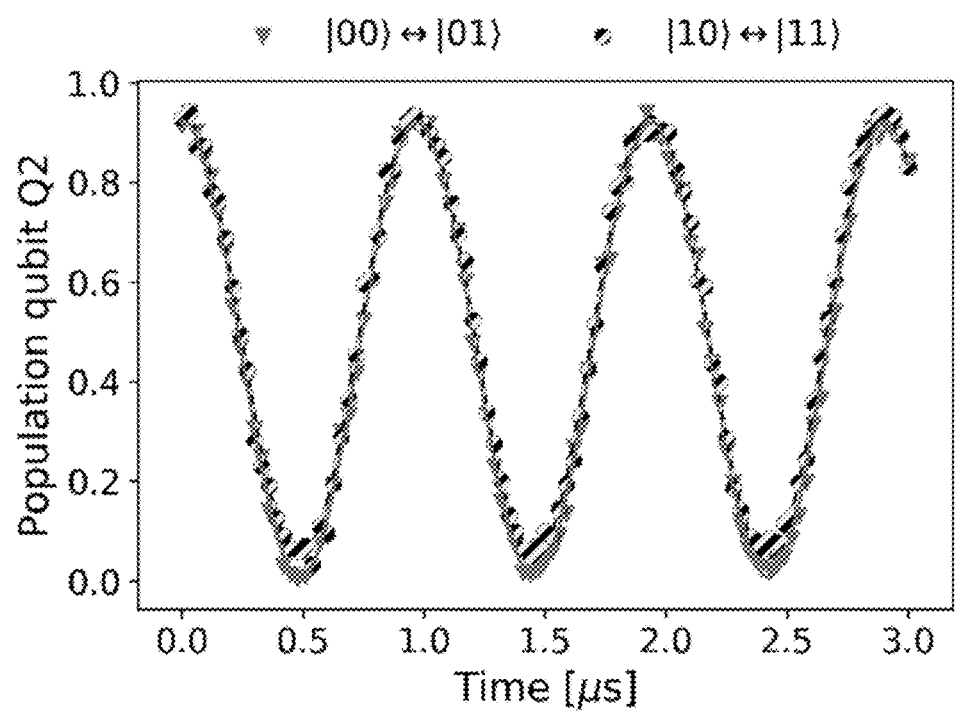
FIG. 8 similarly depicts Ramsey measurements of the same qubit as in FIG. 7, once the cross-talk compensation is switched on, as in embodiments. The two oscillation rates match, indicating that qubit-qubit cross talk has been removed.

Applying a tone at the frequency where the $\hat{z}\hat{z}$ shift disappears compensates the qubit cross-talk. This can be seen by performing four Ramsey measurements on the second qubit Q2, in an arrangement such as depicted in FIG. 1 or 2. In the first situation, no compensation signal is used (FIG. 7). The frequency of qubit Q2 is measured when qubit Q1 is in its ground state (grey curve in FIG. 7) and when qubit Q1 is in an excited state (curve with diagonal stripes in FIG. 7). The oscillation rate shown by the Ramsey measurements in FIG. 7 differ by 70 kHz, indicating that the frequency of qubit Q2 depends on the state of qubit Q1, as expected in case of cross-talk. Now, when the compensation signal is applied the rates match, as shown in FIG. 8, indicating that the qubit $\hat{z}\hat{z}$ cross-talk is now compensated.

More generally, a compensation signal can be adjoined to each driving signal, to accordingly compensate for cross-talk. Yet, since a tunable coupler can be concomitantly driven at distinct frequencies, several compensation signals may be embedded in the applied signals, so as to simultaneously shift and thus compensate several states of the system. Thus, as one understands, the present invention can more generally be embodied so as to shift and thus compensate one or more states of the quantum circuit system (excluding states of the tunable coupler) for cross-talk between the quantum circuits.

Referring now more specifically to FIGS. 1-3, and 5, another aspect of the invention is described in detail, which concerns a quantum processing device 1. The main features of this device have already been described in reference to the present methods and are therefore only briefly reminded here.

This device 1 includes n quantum circuits 11, 12 (n≥2, preferably fixed-frequency circuits), which normally have distinct frequencies (to simplify the operation of the system), in addition to a tunable coupler 20, to which the quantum circuits are coupled. More than two quantum circuits may possibly be involved (n≥3).

The coupler 20 is designed in such a manner that its frequency can be modulated upon application S60 of a signal, as described earlier. Again, the coupler 20 may possibly be concomitantly modulated at m frequencies, m≥2, and the coupling element 20 is not meant to be used as a computational qubit.

In addition, the device 1 includes a control unit 50, configured in the processing device 1 to apply two types of signals, including a compensation signal to compensate for cross-talk between the circuits, as described earlier. In particular, the unit 50 may be designed to modulate the frequency of the tunable coupler 20. In all cases, the unit 50 makes it possible to drive energy transitions between pairs of states spanned by the quantum circuits and achieve entangled states, as already discussed in reference to the present methods. The control unit 50 typically includes a control line 30 (i.e., a physical wire), to apply the signals. Preferably, the unit 50 is designed so as to allow a composite (e.g., parametric, multi-frequency) signal to be applied S60 and, if necessary, to suitably set amplitudes and phases of the applied signals. In particular, and as explained earlier, the unit 50 may be adapted to apply a synthesis signal, which embeds both a primary signal (modulated) and a compensation signal to compensate for cross-talk between the circuits 11, 12, in operation.

The control unit 50 may be implemented as a circuit, such as a linear circuit for example, whereby the synthesis signal applied amounts to a linear transformation of the modulated signal and the compensation signal. Referring to FIG. 3, the control unit 50 may for instance include a first signal generator 51 (to generate and modulate the primary signal), a second signal generator 52 (to obtain the compensation signal), and a combiner 55, where the latter is adapted to combine the compensation signal obtained with the modulated signal, in operation. I.e., the resulting synthesis signal may simply be a mere superposition of the input signals.

In embodiments, the second signal generator 52 comprises a frequency generator to generate a fixed-frequency, continuous-wave microwave signal, as well as a gate 54 and a gate controller 53 to gate the continuous-wave microwave signal generated and obtain the desired compensation pulses, in operation.

Contrary to the depictions of FIGS. 1, 2, embodiments of the present processing devices may involve more than two, e.g., three, four, six or more fixed-frequency quantum circuits, each coupled to a tunable coupler 20. In all cases, the present quantum circuits 11, 12 may for instance be embodied as superconducting quantum circuits, forming the basis computational elements. In particular, the present circuits can be fixed-frequency, transmon-type quantum circuits, realized as single-Josephson junction superconducting qubits. This way, the processing device 1 takes advantage of long coherence times of the fixed-frequency transmons. Note that the coupler 20 too may be realized by a transmon, although the latter will effectively not form part of the basis computational elements.

In all cases, the tunable coupler 20 may be capacitively coupled to each of the quantum circuits 11, 12. In the example of FIGS. 1 and 2, the processing device 1 involves two fixed-frequency, single-Josephson junction superconducting qubits 11, 12 with long coherence times (e.g., transmon-type devices) as the basis computational elements and a tunable coupler 20. In these examples, the tunable coupler 20 is laid out as a non-harmonic oscillator circuit, such as a qubit of the transmon type. Yet, the coupler 20 is given an extra degree freedom, by way of an additional Josephson junction (—✕—), which forms a superconducting quantum interference device (SQUID) loop. As illustrated in FIG. 1, the modulation of the tunable coupler frequency can be realized by altering the magnetic flux φ(t) penetrating the SQUID loop formed by the two Josephson junctions via a current I(t) passed through an inductively coupled flux bias line 30. The modulation of the flux induces a modulation of the effective coupling strength J(t). Each qubit 11, 12 is capacitively coupled (—|⊢) to a readout resonator 41, 42 (i.e., also denoted by R1, R2 in FIG. 1) and may further possibly be coupled to a charge bias line (not shown) for single qubit gate operations, if needed.

The coupling is performed by modulating the frequency of the tunable coupler 20 near or at the frequency corresponding to the desired transitions. The coupler can be regarded as formed by one or more electrodes, as well as the SQUID loop (the latter containing the two Josephson junctions). I.e., the tunable coupler 20 may for instance couple to the transmons 11, 12 via separate electrodes (the latter separated by the SQUID loop) or via a single electrode, with the SQUID loop coupling to the ground. FIG. 2 shows an example geometry for two transmon-type qubits 11, 12 coupled via a third transmon 20 acting as a frequency-tunable coupling element 20. External magnetic flux applied via the inductively-coupled bias line 30 threads the SQUID loop at the center of the tunable coupler 20 and modifies its frequency by modifying the effective Josephson inductance.

Figure 5:
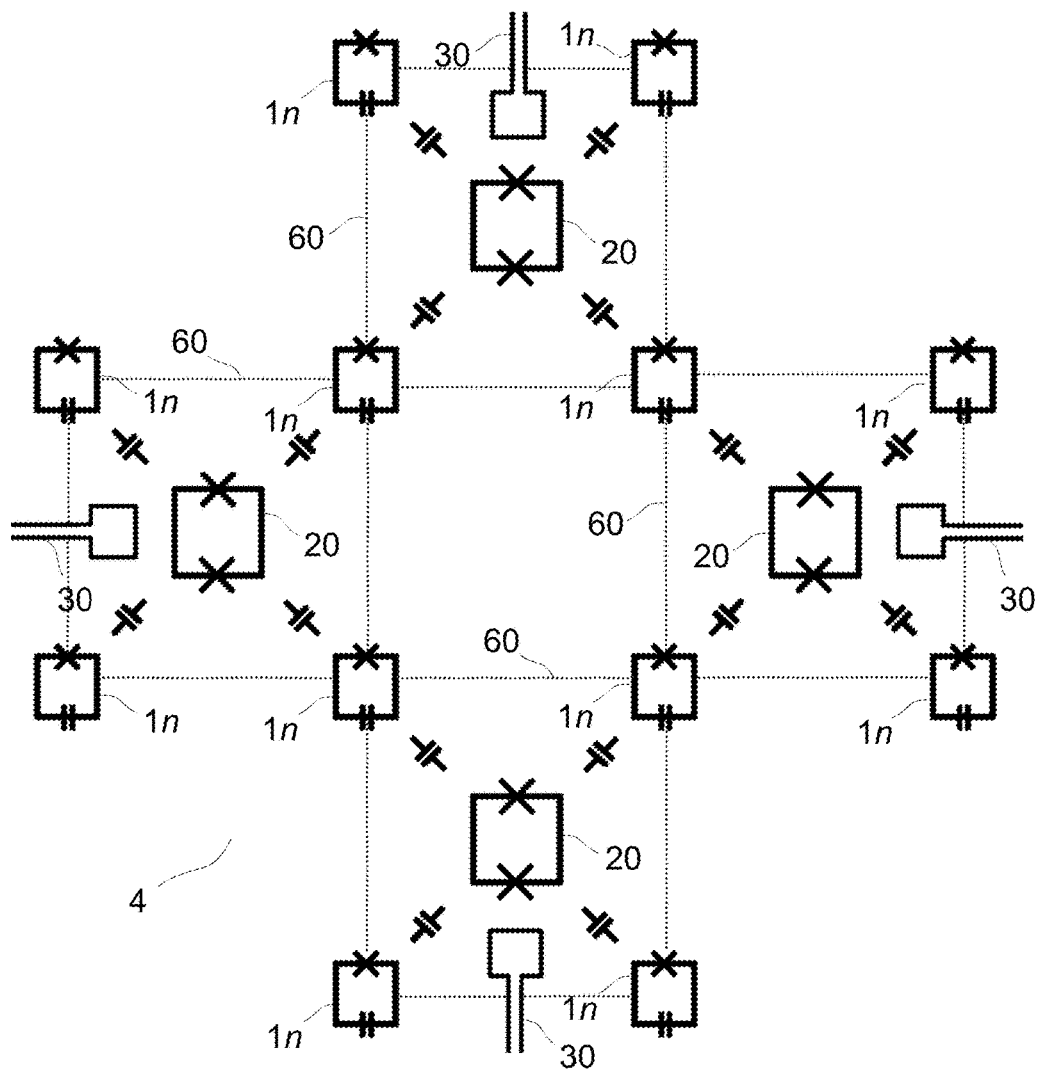
FIG. 5 is a circuit diagram of a quantum processing chip that includes a plurality of cells, each comprising n fixed-frequency qubits coupled to a frequency-tunable coupler, as well as control lines to apply synthesis signals to selected cells and trigger specific energy transitions, while compensating for cross-talk between the qubits, according to further embodiments of the present invention.

A final aspect of the invention is now described in reference to FIG. 5, which concerns a quantum processing chip 4. The latter comprises a plurality of cells 60, each comprising a number of (e.g., fixed-frequency) quantum circuits 1$n$, as well as a tunable coupler 20, to which quantum circuits 1$n$ of that same cell are coupled. In the example architecture of FIG. 5, the cells form a 2D lattice. Note, the central square delimited by the four inner qubits does not correspond to a cell in this example, as they are not coupled to a same tunable coupler. Each of the four inner qubits bridges one cell to a contiguous cell, such that the cells effectively comprise, each, three qubits on average. Yet, the depicted architecture allows four qubits to be operated per cell. Each cell is otherwise similar to a four-qubit arrangement. In the architecture of FIG. 5, all nearest-neighbor qubits can be coupled (except for qubit pairs on the central square). This architecture, however, can be modified to include a coupler at the center to increase the connectivity between the qubits.

A controller system (not shown in FIG. 5) is again used to apply the desired signals, where the latter are for instance applied to each tunable coupler 20, e.g., via respective control lines 30, so as to drive energy transitions in selected cells, while compensating for cross-talk. I.e., cells can be independently operated, via a respective control line 30. For example, the controller system may involve several control units such as depicted in FIG. 3, mapped onto respective cells 60. The operation of the cells follows a logic implemented by the controller system, e.g., so as to achieve a desired state superposition, which in turn allows operations to be performed S90 by the quantum processing chip 4.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A method of operating a quantum processing device comprising at least two quantum circuits coupled to a tunable coupler,
    wherein the quantum circuits are subject to cross-talk, the method comprising:
        applying a primary signal to the quantum circuits so as to drive one or more energy transitions between states spanned by the quantum circuits; and
        applying a compensation signal to the tunable coupler, the compensation signal designed so as to shift at least one state spanned by the quantum circuits, in energy, to compensate for cross-talk between the quantum circuits, and
    wherein the cross-talk between the quantum circuits gives rise to hybridized states of the quantum circuits and the compensation signal is designed such that one of the hybridized states has an energy equal to an energy that one of the bare superposition state spanned by the quantum circuits would have in absence of cross-talk between the quantum circuits.

2. The method according to claim 1, wherein a frequency of the tunable coupler can be modulated so as to drive energy transitions in the quantum processing device and the method comprises applying a synthesis signal to the tunable coupler, wherein the synthesis signal applied includes:
    said primary signal, the latter modulated so as to modulate the frequency of the tunable coupler and thereby drive said one or more energy transitions via the tunable coupler; and
    said compensation signal, so as to compensate for cross-talk between the quantum circuits.

3. The method according to claim 2, wherein the method further comprises, prior to applying said synthesis signal, synthetizing the signal to be applied by:
    modulating the primary signal;
    obtaining the compensation signal; and
    combining the compensation signal obtained with the primary signal modulated.

4. The method according to claim 3, wherein the compensation signal is obtained by:
    generating a signal with a frequency generator; and
    gating the generated signal.

5. The method according to claim 4, wherein
    the primary signal is modulated so as to generate a harmonic microwave signal, and
    the compensation signal is obtained by:
        generating a fixed-frequency, continuous-wave microwave signal; and
        gating the continuous-wave microwave signal generated to obtain a compensation signal pulse.

6. The method according to claim 5, wherein
    the continuous-wave microwave signal generated has a frequency selected so as to reduce a frequency shift between a hybridized state and a bare superposition state of the quantum circuits, wherein the frequency shift is induced by cross-talk between the quantum circuits.

7. The method according to claim 6, wherein
    the frequency of the continuous-wave microwave signal generated is selected so as to effectively suppress said frequency shift.

8. The method according to claim 6, wherein
    said frequency shift corresponds to a two-qubit 22 interaction.

9. The method according to claim 2, wherein:
    each of said quantum circuits is a transmon-type superconducting quantum circuit;
    the tunable coupler is implemented as a superconducting quantum interference device loop, or SQUID loop,
    and wherein
    the synthesis signal applied to the tunable coupler is applied by altering a magnetic flux penetrating the SQUID loop.

10. The method according to claim 1, further comprising setting amplitudes and phases of each of the primary signal and the compensation signal applied.

11. The method according to claim 2, wherein as a result of modulating the primary signal and applying the synthesis signal, the frequency of the tunable coupler is modulated so as to implement a quantum gate operating on said at least one of the quantum circuits, wherein the quantum gate does not operate, effectively, on the tunable coupler.

12. A quantum processing device, comprising
at least two quantum circuits;
a tunable coupler, to which the at least two quantum circuits are coupled, the circuits subject to cross-talk; and
a control circuit, configured in the quantum processing device to apply:
a primary signal to the quantum circuits so as to drive one or more energy transitions between states spanned by the quantum circuits; and
a compensation signal designed so as to shift at least one state spanned by the quantum circuits, in energy, to compensate for cross-talk between the quantum circuits;
wherein the tunable coupler is designed such that a frequency thereof can be modulated so as to drive energy transitions in the quantum processing device and the control circuit is further configured in the quantum processing device to apply a synthesis signal to the tunable coupler, wherein the synthesis signal applied includes:
said primary signal, the latter modulated so as to modulate the frequency of the tunable coupler and thereby drive said one or more energy transitions via the tunable coupler, in operation; and
said compensation signal, so as to compensate for cross-talk between the quantum circuits.

13. The quantum processing device according to claim 12, wherein
the control circuit is implemented as a linear circuit, whereby the synthesis signal is a linear transformation of the modulated signal and the compensation signal.

14. The quantum processing device according to claim 13, wherein the control circuit includes:
a first signal generator configured to generate the primary signal and modulate the primary signal generated, to generate a modulated signal;
a second signal generator designed to obtain the compensation signal; and
a combiner adapted to combine the compensation signal obtained with the modulated signal, in operation.

15. The quantum processing device according to claim 12, wherein
the second signal generator comprises a frequency generator adapted to generate a fixed-frequency, continuous-wave microwave signal, as well as a gate and a gate controller to gate the fixed-frequency, continuous-wave microwave signal generated, in operation.

16. The quantum processing device according to claim 12, wherein
each of said quantum circuits is a superconducting, transmon-type quantum circuit.

17. The quantum processing device according to claim 16, wherein
the tunable coupler is capacitively coupled to each of the at least two quantum circuits.

18. A quantum processing chip, including
a plurality of cells, each comprising:
at least two quantum circuits; and
a tunable coupler, to which the at least two quantum circuits are coupled, the quantum circuits being subject to cross-talk,
wherein the quantum processing chip further comprises one or more further control circuits, configured in the chip to apply, for each of the cells:
a primary signal to respective quantum circuits so as to drive one or more energy transitions between states spanned by the respective quantum circuits via a respective tunable coupler, in operation; and
a compensation signal designed so as to shift at least one state spanned by the respective quantum circuits, in energy, to compensate for cross-talk between two of said respective quantum circuits, in operation of the chip,
wherein the tunable coupler is designed such that a frequency thereof can be modulated so as to drive energy transitions in the quantum processing chip and the control circuit is further configured in the quantum processing chip to apply a synthesis signal to the tunable coupler, wherein the synthesis signal applied includes:
said primary signal, the latter modulated so as to modulate the frequency of the tunable coupler and thereby drive said one or more energy transitions via the tunable coupler, in operation; and
said compensation signal, so as to compensate for cross-talk between the quantum circuits.

* * * * *